United States Patent [19]

Birch

[11] Patent Number: 4,491,745

[45] Date of Patent: Jan. 1, 1985

[54] TTL FLIP-FLOP WITH CLAMPING DIODE FOR ELIMINATING RACE CONDITIONS

[75] Inventor: William A. Birch, Tempe, Ariz.

[73] Assignee: Motorola, Inc., Schaumburg, Ill.

[21] Appl. No.: 407,372

[22] Filed: Aug. 12, 1982

[51] Int. Cl.³ .................... G11C 11/40; H03K 3/289; H03K 5/08

[52] U.S. Cl. ................. 307/272 A; 307/264; 307/291; 307/443; 307/551; 307/559; 307/247 R

[58] Field of Search .................. 307/200 A, 443, 446, 307/454–458, 549, 551, 559, 565, 253, 264, 272 A, 291, 292, 247 R

[56] References Cited

U.S. PATENT DOCUMENTS

| | | | |
|---|---|---|---|
| 3,751,683 | 8/1973 | Drost | 307/455 X |
| 3,828,206 | 8/1974 | Zuk | 307/247 R X |
| 3,993,918 | 11/1976 | Sinclair | 307/291 X |
| 3,996,478 | 12/1976 | Kasperkovitz | 307/291 X |
| 4,027,176 | 5/1977 | Heuber et al. | 307/291 X |

OTHER PUBLICATIONS

Wu, "Master–Slave Flip–Flop", IBM Tech. Disc. Bull., vol 16, No. 7, Dec. 1973, pp. 2131-2132.

*Primary Examiner*—John S. Heyman
*Assistant Examiner*—David R. Hudspeth
*Attorney, Agent, or Firm*—William E. Koch

[57] ABSTRACT

A master slave flip-flop includes a data gate for receiving the input data and generating therefrom first and second internal data signals, and a master section for latching the internal data signals and for transmitting such signals to a slave section during predetermined portions of a clock signal. In order to render the internal data signals symmetrical with respect to each other and therefore substantially reduce the possibility of transmitting incorrect data to the slave as a result of a race condition in the master section, a Schottky diode is coupled within the data gate to complete a discharge path for one of the internal data lines and thus prevent it from exceeding a predetermined voltage.

7 Claims, 1 Drawing Figure

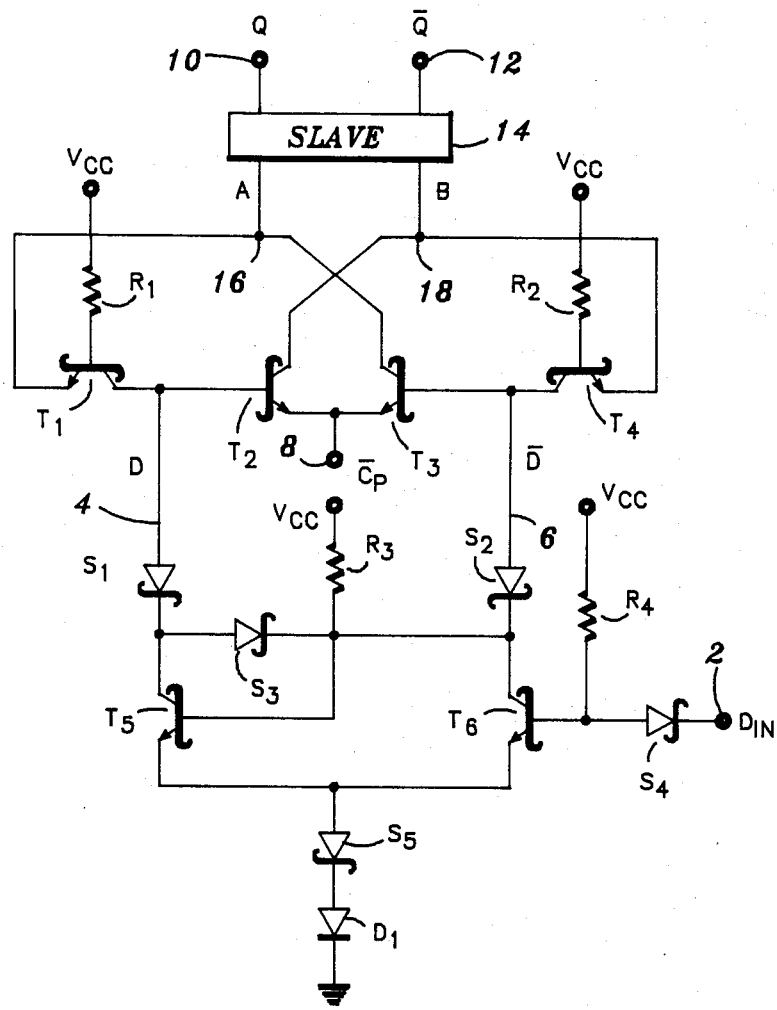

TTL FLIP-FLOP WITH CLAMPING DIODE FOR ELIMINATING RACE CONDITIONS

BACKGROUND OF THE INVENTION

This invention relates generally to master-slave flip-flops and, more particularly, to a master-slave flip-flop having an improved data gate for substantially reducing the possibility of transmitting incorrect data to the slave section due to a race condition in the master section without sacrificing performance speed.

A well known master-slave transistor comprises a data gate having a data input ($D_{in}$) for generating internal data signals (D and $\overline{D}$), a master section for receiving D and $\overline{D}$ and a clock signal ($\overline{C_p}$) and generating in response thereto first and second signals (A and B) indicative of $D_{in}$, and a slave section responsive to A and B for storing the input data and generating the traditional Q and $\overline{Q}$ outputs. Unfortunately, this flip-flop suffers from several disadvantages. The internal data line or signal D when high is permitted to rise from approximately 2 volts to very near the supply voltage level (typically 5 volts) while $\overline{D}$ when high rises to only approximately 2.4 volts. This large voltage swing on the internal data line D may produce an adverse race condition in the master section which results in the transmission of incorrect data to the slave section. Furthermore, the high maximum voltage attainable at D causes a high voltage swing which in turn increases the propogation delays and set-up times. Finally, due to the non-symmetric high and low levels attainable on D and $\overline{D}$, there is a substantial skew between the time it takes to set a "0" ($T_{set0}$) and the time it takes to set a "1" ($T_{set1}$).

SUMMARY OF THE INVENTION

It is an object of the present invention to provide an improved master-slave flip-flop.

It is a further object of the invention to provide an improved data gate for a master-slave flip-flop.

It is a still further object of the invention to provide a master-slave flip-flop including circuitry for reducing unwanted race conditions in the master section without reducing speed of operation.

Yet another object of the invention is to provide an improved master-slave flip-flop wherein the signals appearing on the internal data lines are symmetrical with respect to each other.

According to a broad aspect of the invention there is provided a master-slave flip-flop, comprising: data gate circuit means for receiving input data and for generating therefrom first and second complementary internal data signals representative of said input data; master circuit means coupled to said data gate circuit means for receiving a clock signal and for latching said internal data signals during a predetermined portion of said clock signals; slave circuit means coupled to said master circuit means for storing said internal data signals; and means for clamping at least one of said internal data signals to prevent said at least one of said internal data signals from exceeding a predetermined voltage so as to render said first and second internal data signal symmetrical with respect to each other.

According to a further aspect of the invention there is provided an improved master-slave flip-flop having an output which follows data present at a data input and of the type which includes a master section responsive to a clock signal for receiving internal data signals representative of the input data and a slave section for storing signals representative of said input data, the improvement comprising: data gate circuit means for receiving said input data and for generating therefrom first and second complementary internal data signals representative of said input data; and means for clamping at least one of said internal data signals to prevent it from exceeding a predetermined voltage so as to render said first and second internal data signals symmetrical with respect to each other.

BRIEF DESCRIPTION OF THE DRAWINGS

The above, and other objects, features and advantages of the present invention will be more clearly understood from the following detailed description taken in conjunction with the drawing which is a schematic diagram of the inventive flip-flop.

DESCRIPTION OF THE PREFERRED EMBODIMENT

The flip-flop shown on the drawing comprises a data gate for receiving the input data signal ($D_{in}$) and for generating internal data signals D and $\overline{D}$ on internal data lines 4 and 6 respectively, a master section for receiving a clock pulse $\overline{C_p}$ at terminal 8 and responsive to D and $\overline{D}$ for generating signals A and B which, when the clock signal is low, correspond logically to Q and $\overline{Q}$ appearing at output terminals 10 and 12 respectively, and a slave portion 14 for storing the logic signals appearing at A and B when the clock pulse at $\overline{C_p}$ goes low and for generating the traditional Q and $\overline{Q}$ outputs. The clock pulse $\overline{C_p}$ must begin in its high state (a logical 1) in order to recognize changes in the input data ($D_{in}$). The data is latched at A and B on the trailing edge of the clock pulse.

The data gate includes Schottky transistors $T_5$ and $T_6$, Schottky diodes $S_1$, $S_2$, $S_3$, $S_4$, and $S_5$, diode $D_1$ and resistors $R_3$ and $R_4$. Schottky diode $S_4$ has its anode coupled to the base of transistor $T_6$ and a cathode coupled to input terminal 2. Resistor $R_4$ is coupled between a source of supply voltage $V_{CC}$ and the junction of the anode of $S_4$ and the base of $T_6$. The emitters of transistors $T_5$ and $T_6$ are coupled together and, via the series combination of Schottky diode $S_5$ and diode $D_1$, to ground. The collector of transistor $T_6$ is coupled to the cathode of Schottky diode $S_2$, to the base of transistor $T_5$ and to the cathode of Schottky diode $S_3$. Resistor $R_3$ is coupled between $V_{CC}$ and the base of transistor $T_5$. Finally, the collector of transistor $T_5$ is coupled to the anode of Schottky diode $S_3$ and the cathode of Schottky diode $S_1$.

The flip-flop's master section includes Schottky transistors $T_1$, $T_2$, $T_3$, and $T_4$ and resistors $R_1$ and $R_2$. The emitters of transistors $T_2$ and $T_3$ are coupled together and to terminal 8 for receiving the clock signal $\overline{C_p}$. The base of transistor $T_2$ is coupled to the collector of transistor $T_1$ and to the anode of Schottky diode $S_1$. The base of transistor $T_3$ is coupled to the collector of transistor $T_4$ and to the anode of Schottky diode $S_2$. The emitter of transistor $T_1$ and the collector of transistor $T_3$ are coupled to node 16, and the collector of transistor $T_2$ and the emitter of transistor $T_4$ are coupled to node 18. The above described signals A and B appear at nodes 16 and 18 respectively. Finally resistors $R_1$ and $R_2$ are coupled between $V_{CC}$ and the base electrode of transistors $T_1$ and $T_4$ respectively.

To illustrate how the problems described above arise, it will be assumed that Schottky diode $S_3$ is not in the circuit. Furthermore, throughout the following description, a logical high and a logical low will be represented by "1" and "0" respectively. Furthermore, it will be necessary to describe voltage levels appearing at various points in the circuit under certain conditions of $D_{in}$ and $\overline{C_p}$. Thus, the voltage appearing across a standard diode or the base-emitter of any of the transistors will be referred to as $\emptyset$. The voltage across a Schottky diode will be represented by $ and the voltage drop across a transistor in saturation will be represented by "SAT".

Assume first that Q is "0", $D_{in}$ is "1" and $\overline{C_p}$ is "1". Current will flow through resistor $R_4$ turning transistor $T_6$ on. The voltage at the collector of transistor $T_6$ will then be approximately $\emptyset+\$+SAT$. Since $\emptyset$ is approximately 0.7 volts, $ is approximately 0.5 volts and SAT is approximately 0.2 volts, the voltage at the collector of transistor $T_6$ may be considered to be $2\emptyset$. Therefore, the voltage of the internal data signal $\overline{D}$ appearing on line 6 will be $2\emptyset+\$$. Since the base of transistor $T_5$ is at a voltage $2\emptyset$, it remains off. The voltage of internal data signal D appearing on line 4 will be $V_{CC}-\$$. The "$-\$$" term which appears in the voltage equation at D is due to the Schottky clamp which appears across all of the transistors shown in the drawing.

With D equal to $V_{CC}-\$$ and $\overline{D}$ equal to $2\emptyset+\$$, D may be considered high and $\overline{D}$ considered low.

When $\overline{C_p}$ begins to go low (i.e. on the trailing edge of the clock pulse), the base of transistor $T_2$ is at a higher voltage than the base of transistor $T_3$. Thus, transistor $T_2$ turns on first pulling node 18 down and turning on transistor $T_4$. This in turn prevents transistor $T_3$ from turning on. Thus, A may be considered to be a logical high while B is at a logical low. This information is passed into the slave section resulting in a high Q and a low $\overline{Q}$.

Clock pulse at $\overline{C_p}$ is permitted to go all the way down to a SAT level and once there, changes in $D_{in}$ will not effect the state of transistors $T_2$ or $T_3$. When the clock pulse $\overline{C_p}$ again goes high, transistors $T_2$ and $T_3$ are turned off, the data which was at A and B when $\overline{C_p}$ was low is now stored in the slave, and A and B rise to a high level.

If now the data input signal were to go low ($D_{in}=0$), transistor $T_6$ would turn off and current would flow via resistor $R_3$ into the base of transistor $T_5$ turning it on and thereafter, via Schottky diode $S_5$ and diode $D_1$, to ground. Now, the voltage at the collector of transistor $T_6$ equals the voltage at the base of transistor $T_5$ ($2\emptyset+\$$). Thus, $\overline{D}$ equals $2\emptyset+2\$$. The voltage at the collector of transistor $T_5$ equals $2\emptyset$ and therefore D equals $2\emptyset+\$$.

It can now be seen that D may switch from a low level of $2\emptyset+\$$ to a higher level of $V_{CC}-\$$ while $\overline{D}$ switches from a low level of $2\emptyset+\$$ to a high level of $2\emptyset+2\$$. Clearly the switching characteristics of D and $\overline{D}$ are non-symmetrical with respect to each other.

When $\overline{C_p}$ falls, the base of transistor $T_3$ is higher than the base of transistor $T_2$. Therefore, $T_3$ turns on causing its collector (node 16) to go low which turns on transistor $T_1$ latching transistor $T_2$ off. Thus, A and Q go low, and B and $\overline{Q}$ go high.

The problem with this arrangement is that with D charged up to $V_{CC}-\$$ and $\overline{D}$ to $2\emptyset+\$$, a condition is imposed on A and B which, with a very small differential voltage between the bases of transistors $T_2$ and $T_3$, can result in an undesirable race condition. The problem may be illustrated as follows. The status of the circuit is: $D_{in}$ is "0", Q is "0" and $\overline{C_p}$ is again "1". When $\overline{C_p}$ now goes to "0", the voltage at the base of transistor $T_6$ is $, transistor $T_6$ turns off, the voltage at $\overline{D}$ is $2\emptyset+2\$$, and the voltage at D is $2\emptyset+\$$. The clock signal $\overline{C_p}$ is a low (is at a SAT), the base of transistor $T_3$ is at $\emptyset+SAT$, and node 16 is at 2 SAT since transistor $T_3$ is on. The base of transistor $T_1$ is at $\emptyset+2$ SAT and the base of transistor $T_2$ is at 3 SAT. Thus, the base of transistor $T_2$ is below its threshold and therefore transistor $T_2$ remains off. The base of transistor $T_4$ is at $\emptyset+SAT+\$$ which is equivalent to $2\emptyset$. Node 18 is connected to a transistor in the slave (not shown) the base of which is at $2\emptyset+\$$. Therefore, node 18 (and B) is at $\emptyset+\$$. Thus, there is a differential voltage between A and B (i.e. nodes 16 and 18 respectively).

When the clock signals $\overline{C_p}$ again goes high, transistor $T_2$ and $T_3$ turn off. The voltage at the base of $T_1$ becomes $2\emptyset+2\$$, and the voltage at the base of $T_4$ becomes $2\emptyset+3\$$. The voltage at node 16 (A) becomes $\emptyset+2\$$, and the voltage at node 18 (B) becomes $\emptyset+3\$$. Thus, A and B are separated only by a $. Since the base of transistor $T_3$ is higher than that of transistor $T_2$, $T_3$ should turn on faster when $\overline{C_p}$ again goes low. This is enhanced since the collector of $T_3$ is at a lower voltage than that of $T_2$ and therefore $T_3$ has a built-in advantage in the race against transistor $T_2$. It should be clear by now that in the race between transistors $T_2$ and $T_3$, in general, the transistor having the higher voltage at its base and the lower voltage on its collector will turn on first and latch the input data.

The problem manifests itself when the input voltage $D_{in}$ now changes. With $D_{in}$ equal to a "1", transistor $T_6$ turns on, and transistor $T_5$ turns off. The clock pulse voltage is high (at $V_{CC}$), $\overline{D}$ is at $2\emptyset+\$$, D is at $V_{CC}-\$$, node 16 (A) is at $V_{CC}-\emptyset$, and node 18 (B) is at $\emptyset+2\$$. If the input data should now change to a 0 ($D_{in}=0$), $\overline{D}$ becomes $2\emptyset+2\$$, node 18 (B) becomes $\emptyset+3\$$, D becomes $2\emptyset+\$$, but A (node 16) does not change. It stays at $V_{CC}-\emptyset$ since there is no way to discharge it. If the clock pulse $\overline{C_p}$ should now go low, the collector voltage of transistor $T_3$ is substantially higher than that of $T_2$, and even though transistor $T_3$ may turn on first, it has to pull its collector all the way down from $V_{CC}-\$$ and therefore may lose the race with transistor $T_2$ resulting in incorrect data being stored in the slave section.

This problem in addition to others described previously is solved by adding Schottky diode $S_3$. Now when the input data ($D_{in}$) becomes high, and transistors $T_6$ and $T_5$ turn on and off respectively, the voltage at D cannot charge any higher than $2\emptyset+2\$$. Not only does this prevent the voltage at node 16 from being substantially greater than the voltage at node 18 as described previously, but now the signals appearing at D and $\overline{D}$ are symmetrical. That is, when D is high it is at $2\emptyset+2\$$ and when low it is at $2\emptyset+\$$. Similarly, when $\overline{D}$ is high it is at $2\emptyset+2\$$ and when low it is at $2\emptyset+\$$. Not only has the possibility of an unwanted race condition been substantially eliminated without increasing propogation delay or setup time, but the added symmetry has also substantially eliminated the skew between between $T_{set0}$ and $T_{set1}$.

The above description is given by way of example only. Changes in form and details may be made by one skilled in the art without departing from the scope of the invention.

I claim:

1. A TTL flip-flop, comprising:
   data gate circuit means for receiving input data and for generating therefrom first and second complementary internal data signals representative of said input data;

master circuit means coupled to said data gate circuit means for receiving a clock signal and for latching said internal data signals during a predetermined portion of said clock signal;

slave circuit means coupled to said master circuit means for storing said internal data signals; and means for clamping at least one of said internal data signals to prevent said at least one of said internal data signals from exceeding a predetermined voltage so as to render said first and second internal data signal symmetrical with respect to each other.

2. A flip-flop according to claim 1 wherein said means for clamping comprises diode means for completing a discharge path for said at least one of said internal data signals.

3. A flip-flop according to claim 2 wherein said data gate circuit means comprises:

a first transistor having a base electrode for receiving said input data, a collector for receiving said first internal data signal and an emitter for receiving a first source of supply voltage; and a second transistor having a base coupled to the collector of said first transistor, a collector for receiving said second internal data signal and an emitter for receiving said first source of supply voltage, the base of said second transistor and the collector of said first transistor for receiving a second source of supply voltage, said diode means having an anode coupled to the collector of said first transistor and a cathode coupled to the base of said second transistor and to the collector of said first transistor.

4. A flip-flop according to claim 3 wherein said diode means is a Schottky diode.

5. An improved TTL flip-flop having an output which follows data present at a data input and of the type which includes a master section responsive to a clock signal for receiving internal data signals representative of the input data and a slave section for storing signals representative of said input data, the improvement comprising:

data gate circuit means for receiving said input data and for generating therefrom first and second complementary internal data signals representative of said input data; and means for clamping at least one of said internal data signals to prevent it from exceeding a predetermined voltage so as to render said first and second internal data signals symmetrical with respect to each other.

6. An improved flip-flop according to claim 5 wherein said means comprises diode means for completing a discharge path for said at least one internal data signal.

7. An improved flip-flop according to claim 6 wherein said diode means is a Schottky diode.

* * * * *